Nov. 3, 1964 D. T. KELLEY 3,155,936

TRANSISTOR DEVICE WITH SELF-JIGGING CONSTRUCTION

Original Filed April 24, 1958 2 Sheets-Sheet 1

INVENTOR.
DALE T. KELLEY
BY Mueller & Aichele
ATTORNEY

TRANSISTOR DEVICE WITH SELF-JIGGING CONSTRUCTION

Original Filed April 24, 1958 2 Sheets-Sheet 2

INVENTOR.
DALE T. KELLEY
BY Mueller & Aichele
ATTORNEY

3,155,936
TRANSISTOR DEVICE WITH SELF-JIGGING CONSTRUCTION

Dale T. Kelley, Phoenix, Ariz., assignor to Motorola, Inc., Chicago, Ill., a corporation of Illinois Original application Apr. 24, 1958, Ser. No. 730,642. Divided and this application Nov. 21, 1961, Ser. No. 153,906
6 Claims. (Cl. 338—329)

This invention relates to manufacturing and structural improvements in the semiconductor art, wherein the devices produced for use in electronic equipment are of diminutive size, and more particularly to alloy junction transistors of such size, as well as to an improved method for making such devices, and to apparatus for practicing such method. The invention provides a highly mechanized, efficient and economical assembly operation and a device which lends itself to mass production, while permitting changes in the semiconductor subassembly within the device to permit a ready change to many different predetermined operating characteristics for the device which make it possible to adapt the same to many different equipment application specifications. This flexibility is accomplished by the present invention with only minor changes in the process, manufacturing apparatus, and device structure itself.

This application is a division of a copending application of Dale T. Kelley, Serial No. 730,642, now abandoned, filed April 24, 1958, and assigned to the present assignee.

In order to obtain certain electrical characteristics such as good high frequency response, it is desirable, in the present state of the art, to make a transistor quite small, or one might say, relatively minute. The manufacture of such relatively minute devices poses many practical fabrication problems due to the size of the articles being assembled. Since a transistor normally includes several separate parts, the assembly process involves the alignment and connection of such parts in an accurate and uniform manner. Because the parts being assembled often have dimensions of only a few hundredths or even thousandths of an inch, their accurate positioning is extremely difficult. For example, certain alloy junction transistors include a wafer or die of a semiconductor material such as silicon or germanium which carries on its opposite faces minute electrodes of an impurity metal such as indium. The electrodes must be positioned accurately directly opposite one another on the germanium or silicon die, and then heated so that they will fuse to the surface of the semiconductor die and alloy into it a controlled distance in order to create two suitable rectifying junctions. Suitable lead wires must be electrically connected to each electrode in order to connect the device into a circuit. Since the diameter of the electrodes is often in the order of about 0.01 inch, it is difficult to align them directly opposite one another and it is equally difficult to position the lead wires accurately and secure them to the electrodes.

For instance, in a device wherein a semiconductor die carrying alloyed electrodes is connected to a mounting to form a subassembly which in turn is secured to the posts of a mounting header for the complete device, the small size of the parts involved, makes proper alignment of the subassembly with the header posts difficult. Its successful accomplishment in prior practices requires the use of expensive special jig and assembly equipment such as lead attaching pantographs which greatly reduce applied motion and thus permit relatively accurate positioning of the component parts, and prior practices require skilled labor when they are assembled by hand. Such hand assembly methods are slow and add materially to production costs. Of equal, or possibly of greater importance, is the matter of producing relatively minute semiconductor devices in the large commercial quantities required, and attaining uniformity in assembly and in operating characteristics for a particular design. Failure to solve this problem in this art has kept the manufacturing yield rate low, and kept the cost of the accepted units high.

Accordingly, it is a highly desirable objective to eliminate hand assembly and utilize mechanized or automatic assembly techniques in the manufacture of semiconductor devices such as transistors, but the accomplishment of the objective has left much to be desired in the past.

Another highly desirable objective in semiconductor device manufacture is the standardization of assembly procedure and equipment. At present, most commercial assembly procedures and equipment are relatively inflexible and can be used to manufacture only one or a few specific devices. Since the state of the art is advancing quite rapidly, they quickly become obsolete. Consequently, substantial savings in capital investment for new equipment could be made if the same or slightly modified equipment could be used in the manufacture of devices having different types of semiconductor die units and consequently different operating characteristics for equally different applications in electronic equipment. This is particularly important in this art, because relatively it is in its infancy and electronic equipment must be developed to utilize the semiconductor devices. With the development of equipment new devices are required. In all, it is a rapidly advancing art where there has been great obsolescence in methods, manufacturing apparatus, and devices as the art advances.

There could also be a substantial reduction in manufacturing costs if there could be some standardization of parts which could be used with many devices with different characteristics so as to require only one type of assembly equipment for all such different devices.

Another factor tending to increase the cost of semiconductor manufacture is the loss of expensive component parts when rejected transistors or other semiconductor devices are destroyed. In many transistor constructions, for instance, both the mounting header and the die unit must be discarded if the transistor fails to meet electrical specifications. In the great majority of cases, however, failure of a transistor to pass electrical specifications is due to some defect in the semiconductor die unit rather than to any defect in the mounting header. The mounting header is an expensive component of the transistor, but entirely satisfactory ones must be discarded if it is not possible to easily and quickly remove a faulty semiconductor die unit, when the transistor fails to meet the specifications in a stage of assembly prior to final canning. Such mounting headers would be suitable for reuse with other semiconductor die units, however, if they could be easily detached from the faulty die unit.

In the manufacture of alloy junction semiconductor devices, wherein the internal dimensions between alloyed junctions on the semiconductor die are critical, the penetration of the alloyed electrode into the die during alloying is material. This alloying penetration or depth depends upon alloying temperature, volume of alloying metal present, and contact area between the metal and the semiconductor die surface. When two electrodes, such for instance, as an emitter and a collector are alloyed to a die simultaneously and at the same temperature, it has proven difficult to control accurately the alloying depths of both electrodes and the internal dimension between the junctions. However, the art has considered that simultaneous alloying was necessary to economize time and handling and hence minimize production costs.

It is an object of this invention to provide a method of assembling semiconductor devices, which method is characterized by great flexibility and by rapid and simple adaptation to the manufacture of a variety of different devices, and particularly to the manufacture of low and medium power transistors with alloy junctions, so that the same methods and assembly apparatus can be used over a substantial period of time in this rapidly advancing art as changes are made in the operating characteristics of structure of the devices.

A further object of this invention is to provide a manufacturing process and apparatus for diminutive alloy junction semiconductor devices which accomplishes mass production and low cost but a higher yield at the completion of the process than has been possible in the past.

Another object of the present invention is to provide a transistor adapted to be manufactured economically, uniformly and at a high rate of production.

A further object of the present invention is to provide a transistor structure which lends itself to relatively quick and easy assembly of its minute component parts by the use of relatively simple apparatus so as to maintain capital expenditures for apparatus at a minimum.

It is another object of the invention to provide an improved transistor whose structure not only lends itself to manufacture by automatic assembly techniques, but is also standardized to a degree such that a substantially identical mechanical mounting will make possible numerous predetermined and different electrical operating characteristics in different transistors.

It is another object of the present invention to provide an improved transistor structure from which electrically defective semiconductor die units can easily be removed thus enabling the reuse of the mechanical mounting base portion with other die units and the consequent salvage of the cost of such base portions.

A feature of this invention is the provision of a method of assembling alloy junction transistors which improves the accuracy with which electrodes may be positioned on a semiconductor die and suitable leads affixed to the electrodes so as to provide a uniform product coming from an assembly line, and accomplish a high yield and lower costs of manufacture while speeding up the required full production time relative to the yield accomplished.

Another feature of the invention is the provision of a device subassembly made up of a base connector strip and a semiconductor die unit mounted thereon which becomes self-jigging when assembled on four posts or the posts and connector leads on a mounting header. The base connector strip is provided with a pair of arms having engaging means such as hooks formed in their ends for engaging upright posts of a mounting header and enabling the subassembly to be quickly and easily positioned on the header at the posts for soldering thereto. Angularly bent lead wires or posts in the header support and position small wire leads from the electrodes on the semiconductor unit. Because the hooks hold the subassembly against lateral movement, and the pieces settle into a final position on the angularly bent leads and on the straight posts during heating for soldering, and because of the prior application of solder material at the connections to be made, soldering to the header can be carried out quickly and effectively on an economical mass production basis.

Still a further feature of the invention is the off-center mounting of the semiconductor die unit on the aforementioned base connector and consequent off-center weight distribution of the center of such unit so that lead wires extending from the die unit rest on and slide along the aforesaid turned-over or angularly bent ends of the header mounting posts or leads as the subassembly settles into position on the header. Each post or upright lead is "on-center" in the header and the four provided in one embodiment are equilaterally placed therein, but the turned-over or angularly bent portion of each is "off-center" and the subassembly lead wires rest on the same. This construction and dimensioning assures that contact is maintained between the subassembly lead wires and its connector strip and the mounting posts during soldering of the subassembly to the header, and prevents the production of devices wherein the parts are imperfectly connected by solder to the header.

Figures 1, 2, 4:
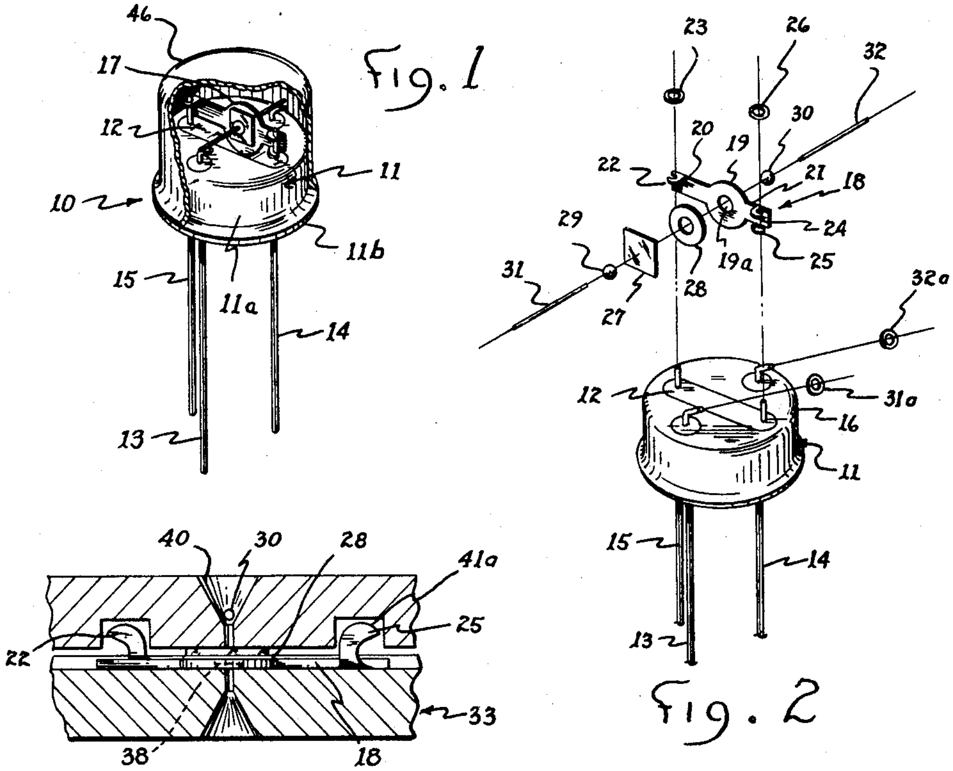
FIG. 1 is a greatly enlarged view in perspective of a transistor of the present invention with its cover member broken away to show its internal structure.
FIG. 2 is an exploded view of the transistor shown in FIG. 1, with the same enlargement to better illustrate the components making up the unit.
FIG. 4 is a fragmentary view in section through a closed jig of the type shown in FIG. 3, but enlarged over the showing in FIG. 3, and illustrating the dropping of a minute metal bead toward one face of a semiconductor die.

In practicing the present invention as directed particularly to a method for making alloy junction devices such as so-called transistors and such devices resulting therefrom, I provide a production line over which manufacturing steps are accomplished with a maximum of automatically operated equipment of apparatus and a minimum of hand labor to provide mass production of these diminutive or relatively minute devices wherein a high degree of uniformity in structure and electrical operating characteristics are accomplished. This in turn provides a high yield in terms of acceptable units coming from the mass production operation.

The minute parts of a semiconductor subassembly are assembled in large multiples and primarily by automatically operated apparatus into heat resistant jigs which are then each moved into fusion furnaces for the heating and fusion together of semiconductor subassemblies. The collector and emitter electrodes and the wire leads extending therefrom are the most critical so far as the position thereof on the semiconductor die and so far as the fusion thereof together are concerned, and accuracy of position and complete fusion are accomplished by loading and then fusion of first one electrode and then the other, and then loading and fusion of one wire lead on an electrode and thereafter the other wire lead on the other electrode. In this manner each handling of a piece or part can be brought up to maximum efficiency and each of the four fusion furnaces used for the two electrodes can be provided with an atmosphere and a temperature to accomplish the best fusion conditions for the different electrodes.

After completion of the subassembly, and at subsequent loading positions in the production line, the mounting member or header for the semiconductor devices such as a transistor, and the semiconductor subassembly are placed together and this is automatically moved into a fifth fusion furnace for soldering together which accomplishes the assembly of all mechanical parts of the device except the final cover or can.

With the mechanical assembly complete, each device in this stage of completion is automatically electrolytically etched for cleaning, is washed to remove the solution, and electrically tested. Then a cover is placed on those assemblies which have not been rejected at the electrical testing stations for unacceptable characteristics or inoperativeness.

This invention also includes an improved device-structure which emphasizes the effectiveness of the process and apparatus just described. The semiconductor subassembly for such device includes a flat enlarged metal strip which not only serves as part of the mechanical mounting means for the subassembly on a mounting header as well as an electrical connector, but lends itself to the production of a plurality of subassemblies in an improved single heat-resistant jig. A plurality of such strips are placed in the jig and quickly aligned in a proper position so as to receive first a semiconductor die on each strip, and then metal electrode beads to be fused thereto, and lead wires to be fused to the electrodes so that electrical connections can be made to the semiconductor subassembly. The connector strip serves to mount a semiconductor die and additionally includes hooks on each end by which the final subassembly can be readily and simply positioned on corresponding posts of the mounting header.

The mounting header also represents an advance in the art of commercial importance in that four posts are equilaterally mounted therein and two of the four posts on the header are bent over at an angle to receive the wire leads from the subassembly while the connector strip hooks are positioned on the straight posts to center that element, wherein the subassembly is held in position on the header prior to and during final soldering. The four posts are insulated in the header from a metal covering, and an insulating portion between the straight posts extends through such covering and between such two posts so that the strip will not be short circuited with the covering. In this respect, the configuration of the connector strip in combination with the header also facilitates the final assembly. The semiconductor die on the strip is off-center. Although the four posts in the mounting header are secured therein in an equilateral position, the off-center arrangement of the semiconductor die on the connector strip insures that the thin wire leads extending in opposite directions from the electrodes thereon rest securely in the extended turned-over portion of each of two of the posts. Each such portion slopes toward the base portion of the post which is in the equilateral position described. As a result, the positioning of the semiconductor subassembly on the mounting header can be rapid because of the tolerances provided by the length of each turned-over portion. Solder material is at the joints and the subassembly settles down the sloping portion into a rigid predetermined position on the header when the solder is melted in the fifth fusion furnace.

Not only does the complete mechanical structure of the device of this invention lend itself to quick and accurate assembly without jigs except the heat resistant block unit, but this same structure and the soldered connections of the subassembly to the header make it possible to heat and unsolder this subassembly from the header if the final electrical test before canning shows the subassembly to be unacceptable from an electrical and operating standpoint. Being able to salvage the header represents a substantial saving in cost of manufacture, and adds to other savings represented in the complete embodiment of the invention.

FIG. 1 of the accompanying drawings shows a perspective view of a completed transistor of the present invention with the cover portion broken away. FIG. 2 is an exploded view of the same transistor more clearly showing its component parts. The transistor generally indicated at 10 includes a mounting header 11 which comprises a disc-like member 12 of glass or other suitable insulating material covered with a sheet of metal 11*a* such as the alloy "Kovar" except for the areas immediately adjacent the mounting leads or posts and an elongated area between two of the posts. Passing through the glass disc and supported therein are the header mounting leads or posts including the emitter lead or post 13, the collector post 14, and the base post 15. A fourth post 16 also is held in the header but does not pass completely through it as do the other posts, and serves no electrical purpose but acts merely as a convenient mechanical support. The posts 13–16 are of a suitable conductive metal or alloy such as an iron-nickel alloy which can be sealed to the insulating material of the mounting base.

The subassembly generally indicated at 17 is mounted on the posts 13–16 and is made up of the base connector and die supporting member 18 which itself comprises a round enlarged or extension portion 19 and extending arm portions 20 and 21. Arm 20 is somewhat longer than arm 21. The portion 19 of the base connector 18 is provided with an opening 19*a*. The arm 20 is provided with a hook member 22 adapted to engage the base post 15 and is soldered thereto. Soldering may be accomplished with a solder ring 23 (shown in FIG. 2) or by other solder applications lending themselves to mass production. The arm 21 is provided with a pair of hooks 24 and 25 which engage the post 16 and are soldered to it by means of a solder ring 26, or other suitable soldering as described for the connection on post or lead 15. The base connector member, in accordance with one embodiment of the present invention is made of a nickel-containing alloy "Kovar." However, other suitable conductive material may be used having about the same thermal coefficient of expansion as the semiconductor die and to which the die can conveniently be connected. Metallic nickel is a suitable material.

The subassembly 17 also includes the semiconductor wafer or die 27 which is secured to the enlarged portion 19 along the periphery of opening 19*a* by means of the solder ring 28 which is made of solder of high lead content. The die 27 fits over the opening 19*a* and carries on its faces metal beads which serve as electrodes. The bead 29 serves as the emitter electrode of the transistor while the bead 30 serves as the collector electrode. The subassembly 17 is arranged with emitter electrode 29 extending into opening 19*a*. Emitter lead 31 is fused to emitter electrode 29 while collector lead 32 is similarly secured to collector electrode 30.

The leads 31 and 32 from the subassembly 17 rest on the overturned or sloping ends of posts 13 and 14 respectively, and are soldered to them by a suitable production means as by the melting of solder preforms 31*a* and 32*a*.

The structure of the transistor 10 makes it well adapted to manufacture by automatic assembly techniques, and is suitable for any one of a variety of low or medium power transistors in which the amount of heat generated at the rectifying junctions is small enough to be successfully dissipated through wire leads. Once the subassembly 17 has been separately fabricated, the attachment thereof to the header 11 may be carried out expeditiously in a manner to be described subsequently. However, because of the very small size of the component parts of the subassembly (the overall length of the base connector 18, for example, in one embodiment of the invention is only about 0.200 inch) special techniques are employed which provide for its quick, accurate and economical manufacture. Accuracy of assembly is particularly important since electrical connection is made through the very fine wire leads 31 and 32, which in turn are fused to the very small electrode beads 29 and 30.

Figure 7:
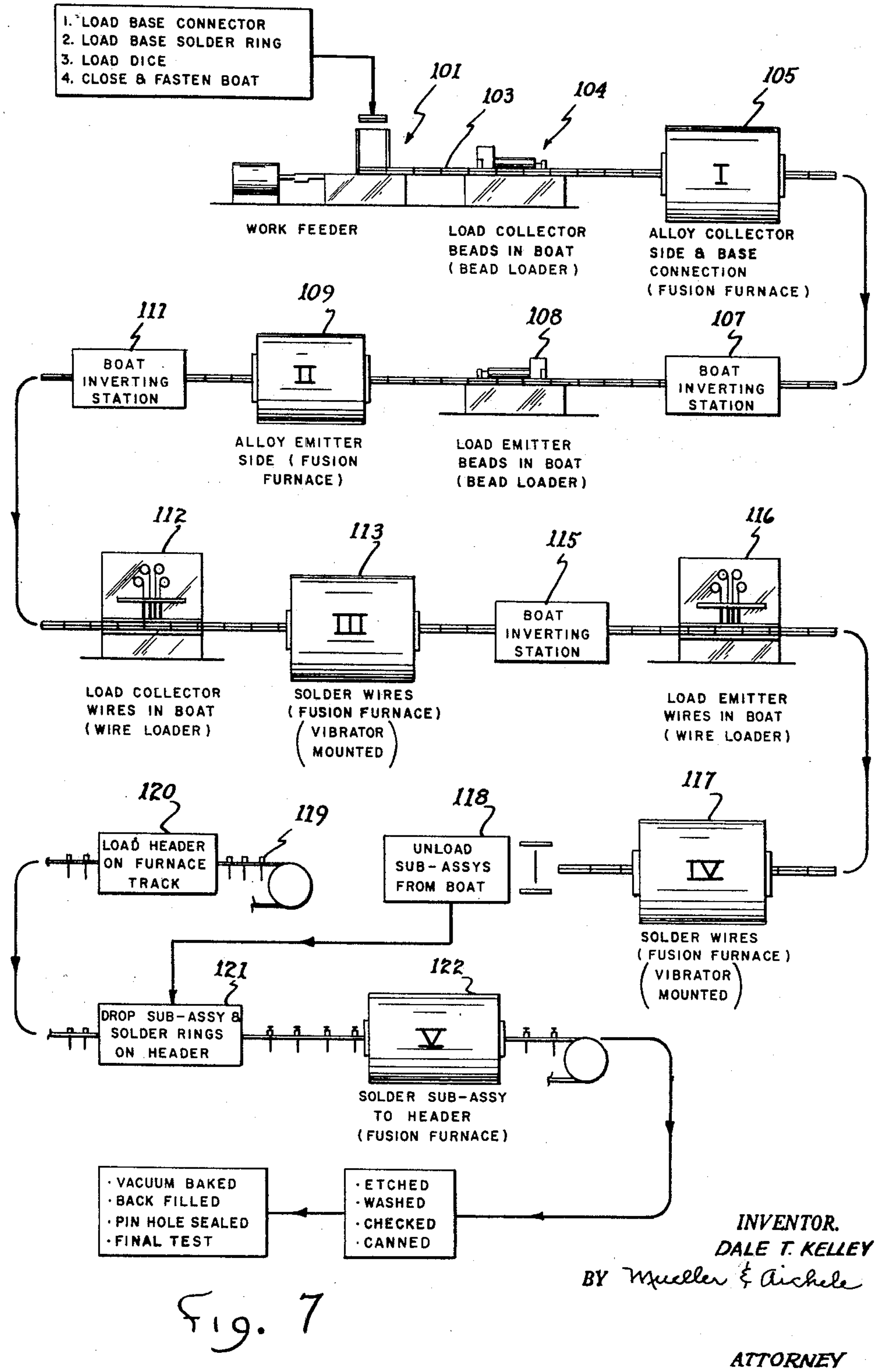
FIG. 7 is a flow sheet illustrating the various steps of the assembly process and showing assembly equipment in diagrammatic form.

FIG. 7 shows in diagrammatic form a flow sheet of the various steps of the method of fabricating the subassembly 17. The first step in this process is the positioning of the base connector 18, the solder ring 28 and the semiconductor die 27 in the jig generally indicated at 33 in FIG. 3. This step is accomplished at the loading station 101 on FIG. 7. Solder ring 28 is preferably dipped in a mixture of ammonium chloride and alcohol to provide a flux. The jig 33 is composed of blocks 34 and 35 made of graphite, steel or some other suitable material capable of withstanding heat. The block 35 has formed therein a number of depressions indicated generally at 37 in its face 36, and shaped to accommodate the base connectors 18. The depressions are interconnected so that a number of connectors may be placed end to end to increase the number of subassemblies fused or alloyed together at the same time. A boss 38 is provided to accommodate the opening 19*a* formed in the central portion 19 of the base connector. Each boss member 38 is provided with a central passage 39 which passes all the way through the block 35 providing access to the interior portion of the jig when it is closed.

The block 34 has an essentially flat surface 41 with passages 40 passing completely through the block and adapted for alignment with passages 39 when the jig is closed by placing surface 41 of block 34 on surface 36 of block 35. Transverse grooves 41*a* accommodate the hooks of connector 18. The block 35 is provided with a peg 42 which fits into opening 43 of block 34 when the jig is closed. The two halves of the jig are secured together by a screw or bolt passing through holes 44 and 45.

After a series of base connectors 18 have been placed in block 35 of the jig 33, a solder ring 28 (FIG. 4) is placed on each base connector around the opening 19*a* and a semiconductor die 27 is placed on the solder ring. The semiconductor die 27 is made of germanium or silicon of suitable conductivity type and of predetermined resistivity and electrical characteristics. In a specific embodiment of the present invention, the die 27 is of N conductivity type germanium.

The jig 33 is closed in the manner previously described and passes along conveyor means 103 to the collector electrode insert station 104. A collector electrode bead 30 is dropped through the passage 40 as shown in FIG. 4 and falls onto the surface of die 27. The mouth portion of the passage 40 is somewhat enlarged to facilitate insertion of the bead although its bottom portion is of sufficient width to just accommodate the bead thus guiding it into place and assuring accurate positioning on the surface of the semiconductor die 27. In accordance with a specific embodiment of the invention, the collector bead 30 is composed of indium although other suitable acceptor impurity metals which will alloy into the N conductivity type to form a suitable PN junction may also be employed. For example, when using a semiconductor die of N-type germanium, as in the embodiment particularly described, other alloying acceptor metals such as gallium or zinc or alloys of these metals with indium may be used. In the event P-type germanium or P-type silicon is used in the semiconductor die, a donor-type alloying impurity, such as an antimony alloy, forms the electrodes. A specified amount of ammonium chloride-alcohol fluxing solution is introduced through passage 40 to assist in alloying collector bead 30 to die 27.

The jig 33, now containing, in accordance with one embodiment of the invention, 15 sets of parts, each set including the base connector 18, the solder ring 28, the semiconductor die 27 of N-type germanium, and the indium collector bead 30, is placed in the magazine of the collector furnace 105. Successive jigs are moved through the furnace (in accordance with one embodiment of the invention) by the action of a pneumatic pusher which pushes the last-inserted jig from the magazine causing it to displace the next preceding jig along the furnace. In the furnace, the assembly is heated to melt the solder ring 28 and thus attached the semi-conductor die 27 to the base connector 18. The heating also melts the indium collector bead 30 and causes it to alloy into and fuse with the semiconductor die 27. This creates a region of P-type conductivity beneath the surface of the semiconductor die 27 and creates a PN rectifying junction within the die.

The electrical characteristics of an alloy junction type transistor are determined to a considerable extent by the depth of alloying the collector and emitter electrodes since this controls the distance between the PN junction in the semiconductor die. This alloying depth is determined by the volume of alloying material available, the area wet by the alloying material and the alloying temperature. The collector furnace 105 is an electric resistance furnace containing an atmosphere that is inert with respect to the material making up the transistor. In general, such atmospheres are reducing or non-oxidizing. Nitrogen, argon, or a mixture of nitrogen and hydrogen are suitable atmospheres. The temperature maintained within furnace 105 is dependent upon the electrical characteristics to be produced in the transistor since these are, to at least some extent, controlled by the depth of alloying of the indium. In accordance with the present invention, temperatures between about 400° and 700° C. are employed, with high temperatures being used when greater alloying depth is required. In one embodiment of the invention, a temperature of about 580° C. is employed in the collector furnace. In one embodiment of the invention, the total residence time of each jig in the furnace is about 15 minutes with a jig leaving the furnace every 30 seconds. This provides sufficient ttime to obtain equilibrium alloying at the temperature specified. There is no practical upper limit on the heating period since once the alloying of the indium and germanium is accomplished at a particular temperature, it will not proceed further unless the temperature is raised.

The jig 33 is moved from the cooling chamber of furnace 105 to the jig-turning station 107 where it is inverted either manually or by suitable mechanical means so that the block 35 of the jig is now facing up. The turned jig then passes to the emitter insert station 108 and the emitter electrode bead 29 is dropped through the passage 39 (FIG. 5) so that it rests on the surface of the semiconductor die 27 directly opposite the collector electrode 30. In making transistors in which the emitter electrode is somewhat smaller than the collector electrode, the passage 39 is of somewhat smaller diameter than the passage 40 through which the collector bead 30 was dropped. The passage 39 is also flared at its mouth to make insertion of the electrode bead easier and is narrower near its bottom so that it will serve to properly position the indium bead on the surface of the semiconductor die. As in the case of the insertion of the collector bead, the emitter bead is inserted by the mechanical insertion means of FIG. 8 to be described subsequently. A predetermined amount of the ammonium chloride-alcohol fluxing solution is introduced through passage 39 onto bead 29.

The loaded jig 33 then passes to emitter furnace 109 which is identical with collector furnace 105 and employs the same atmosphere, but it is maintained at a somewhat lower temperature to provide for less alloying penetration of the emitter than the collector. For example, in the embodiment of the invention employing a temperature of 580° C. in the collector furnace, a temperature of about 520° C. is employed in the emitter furnace. Once the alloying of the collector bead has been completed to equilibrium in furnace 105, subsequent exposure of the collector to a lower temperature will in no way affect its alloying depth. If both the collector and emitter electrodes were fused to the semiconductor die in the same furnace at the same temperature, that temperature would determine the depth of alloying whereas, in accordance with the present invention, where alloying is carried out in two separate furnaces, at two different temperatures, well controlled depth of alloying can be obtained for the emitter by first fusing the collector electrode to the die at a somewhat higher temperature. In many applications of the invention, such as in the manufacture of diffused base transistors, very shallow alloying is desired for the emitter while deeper penetration is desired for the collector. This is accomplished by first alloying the collector to the desired depth and then alloying the emitter to a lesser depth at a lower temperature so that it does not affect the depth of alloying at the collector electrode. Once the collector has alloyed to its equilibrium depth at a particular temperature the alloy region will not penetrate further unless that temperature is exceeded.

Independent control of alloying depth of the electrodes in the present method and apparatus also permits accurate control of the distance separating the two PN junctions in the semiconductor die or so-called "base width" of the PNP transistor. This dimension has an important effect on the electrical charcteristics of the unit. Because of the independent control of each alloying step the process can be used to manufacture units of different electrical characteristics by varying the alloying temperature. Although the atmosphere and residence time employed in the two electrode alloying furnaces are normally the same, they could be varied if required.

Although the foregoing description has referred specifically to a particular type of alloying and particular materials, it will be understood that the process of the invention can be easily modified to form other types of alloy junctions. For example, the operating conditions of the alloying furnaces could be modified to heat a semiconductor die upon which a metal had been deposited, as by evaporation, and form a so-called "toasted" alloy junction. In such a modified process, the same base connectors, jigs and the like could be used as are employed in the embodiment described in detail. Further, it will be understood that semiconductor dice employed may be of either conductivity type, may contain regions of varying resistivity as in the case of graded base transistors, or may have whatever electrical characteristics are required to produce a predetermined device.

Figures 3, 5, 6:
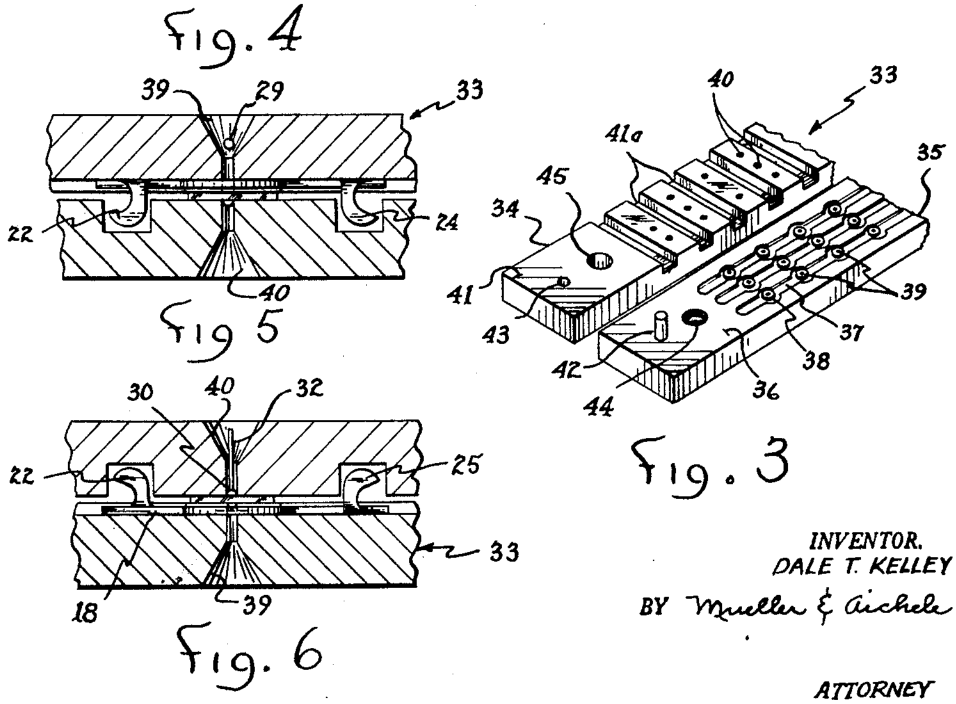
FIG. 3 is an enlarged perspective broken view of one end of each half of a heat resistant jig or boat employed for guiding the pieces to be secured together by fusion or alloying into the semiconductor die unit in an assembly step of the present invention, showing the two halves of the jig in open position.
FIG. 5 is a view similar to FIG. 4 showing the dropping of the other electrode bead toward a position on the opposite face of the semiconductor die.
FIG. 6 is a view in section similar to FIGS. 4 and 5 showing the positioning for affixing of a lead wire to one of the electrodes which is then alloyed onto a face of the semiconductor die.

After the alloying of the emitter electrode 29 has been completed, the jig is turned over at the inverting station 111 and passes to the collector lead insert station 112. At collector lead insert station 112, a collector lead wire 32 is inserted through each passage 40 either by a wire loading mechanism which cuts the leads to length and lock them automatically or by hand, and allowed to rest with its end held against collector electrode 30 by gravity (FIG. 6). The collector lead wire 32 is made of gold-plated silver because of the ease with which indium and gold wet one another so that they can be electrically connected merely by making contact and heating. Unplated silver wire also may be employed but higher temperatures are required. Positioning of the lead wire 32 is accurate because it is guided by the bore of the passage 40 and automatically positioned thereby on the surface of the collector electrode 30. As shown in FIG. 6, lead wire 32 is of such a length that it does not extend beyond the outer surface of the jig. This permits insertion of the jig without disturbing the position of the lead.

The jig with the lead wire 32 inserted therein is then passed by a pneumatic pusher to collector lead furnace 113 which is also an electric resistance furnace containing a neutral or nonoxidizing atmosphere and maintained at a temperature between about 300° and 400° C. In one embodiment of the invention, a temperature of 380° C. is employed. At this temperature the lead 32 readily fuses to the indium electrode 30 and is mechanically affixed and electrically connected thereto. The lead wires are about one-half the diameter of the electrode to which they are fused. It has been observed that they are well centered with respect to the electrodes and this is believed to be due to the surface tension of the indium as it becomes molten during the fusion process. The residence time in the collector lead furnace is substantially the same as that of the two electrode furnaces.

After the attaching of the collector lead the jig passes inverting station 115 from which it passes to the emitter lead insert station 116. At this point the emitter lead 31 is inserted into the passage 39 in exactly the same way as the collector lead 32 was inserted into the passage 40, and the jig passes to the emitter lead furnace 117 where the silver emitter lead wire is fused to the indium by heating under the same conditions as obtained in the collector lead furnace 113. The jig and its contents are then cooled, and the completed subassemblies 17 are removed at station 118 by opening the jig and separating the blocks.

In some instances it has been found desirable to provide means for vibrating the jigs after the leads have been inserted and before they are fused to their corresponding electrodes. Such vibration prevents the leads from becoming stuck in the jig openings in positions where they fail to contact the electrodes, and it generally provides for more effective lead attachment. This may be accomplished by mounting the lead attaching furnaces 113 and 117 so they can be vibrated, and it is indicated in FIG. 7 by reference inasmuch as the details are not a part of the present invention.

In the embodiment of the invention particularly illustrated, the attachment of lead wires to alloyed electrodes is described. It will be understood, however, that the method and apparatus of the invention may be used to attach lead wires to other types of contacts either rectifying or ohmic with the same resulting advantages of ease and accuracy of positioning, reproducibility, high production yield and economy. For example, a semiconductor die having plated electrodes can be positioned within the jig 33 with a base connector and solder ring and the jig introduced into the process at the wire loader 112. Lead attachment is then accomplished in the manner previously described making such changes in furnace temperatures and the like as are expedient for the particular materials employed. Similarly, semiconductor bodies having diffused or grown rectifying junctions and ohmic contacts on their surfaces may have lead wires accurately attached to such contacts in accordance with the present invention. Such flexibility is one of the advantages of the invention since it enables a wide variety of transistors to be manufactured using the same equipment and general assembly procedures and thus tends to keep such equipment from becoming obsolete as transistor structures and characteristics are improved.

The completed subassemblies are of a configuration which facilitates their quick and accurate alignment on a slightly modified standard mounting header having four equilaterally spaced mounting posts. As indicated in FIG. 7, headers 11 are loaded in an upright position onto a moving conveyor belt or track 119 at station 120 and pass to the loading station 121. At this position, an operator or a suitable loading mechanism drops a subassembly onto a header with the hooks 24 and 25 of the shorter arm 21 engaging the dummy or electrically inactive post 16 and with the hook 22 of the longer arm 20 engaging the base mounting post 15 (see FIG. 1). Shorter arm 21 is provided with a pair of hooks to enable an operator to distinguish one end of the base connector from the other and so orient successive subassemblies uniformly with respect to the headers on which they are mounted. When the subassemblies are placed on the headers manually, the operator usually engages post 16 first and then slips hook 22 around post 15.

As the subassembly is placed on the header, the emitter and collector leads 31 and 32 contact the turned-over and sloping end portions of emitter and collector mounting posts 13 and 14 respectively. The end portions are bent toward the shorter arm 21 of base connector 18 and form an angle of about 30° with the upper surfaces of the header.

The hooks at the ends of the base connector arms hold the subassembly 17 against lateral movement with respect to the mounting posts and maintain it in proper alignment to be soldered to the header. This soldering may be accomplished by a soldering iron, but is preferably carried out on a more rapid production basis by a preapplication of solder and then heating and fusing in the furnace 122. In one embodiment, solder rings 23 and 26 (FIG. 2) are dropped over posts 15 and 14 respectively onto the hooks engaging these posts, and solder rings 31*a* and 32*a* are dropped over the turned-over sloping ends of posts 13 and 14 to rest against leads 31 and 32 respectively. The resulting units pass along track 119 (FIG. 7) to furnace 122 wherein the solder rings melt to form joints connecting the subassemblies to their headers mechanically and electrically.

As the subassemblies are placed on the headers, they are roughly oriented with the base connector arms substantially parallel to the upper surface of the header. As the solder rings melt, the subassembly 18 will tend to settle into the stable position shown in FIG. 1 as the lead wires 31 and 32 slide along the bent-over end portions of posts 13 and 14 respectively. Because the semiconductor die 27 is carried on connector 18 in a position somewhat off-set from its center toward the same direction in which the turned-over ends of posts 13 and 14 are bent, the lead wires extending from the die will make contact with the posts even if the subassembly is slightly misaligned, and the chance of making a faulty connection to the lead wires is minimized. As the solder melts, the angular disposition of the post ends insures contact by the leads to be maintained as the subassembly 18 settles into its most stable position.

As the subassembly 18 settles during soldering, the edge of the enlarged portion 19*a* engages the exposed surface of insulating body 12 and is maintained in the stable position shown in FIG. 1. The provision of the exposed insulating area on the header surface for supporting the base connector 18 permits self-jigging of the subassembly 17 on a header which is otherwise of standard design, this construction can be used to mount a wide variety of semiconductor subassemblies.

The shape of the exposed insulating area between posts 15 and 16 prevents short circuiting of the base connector to the metal covering of the header since the connector will not contact the covering 11*a* even if it should be mounted in a tilted position as with one of its arms resting on the header. The provision of the metal cover 11*a* over other portions of the header body 12 improves electrostatic shielding of the unit.

It will thus be seen that the configuration of the base connector 18 and the provision of the bent-over end portions of posts 13 and 14 enables the subassembly 17 to be self-jigging with respect to header 11 so that solder connections can be made easily and accurately at a high rate of production with a high yield of electrically satisfactory units. Because the subassembly is self-jigging, soldering can be accomplished by placing solder rings or placing solder in some other manner on the assembly joints to be soldered and passing it through a furnace. This results in cleaner, better aligned and more uniform units than could be produced by manual soldering since manual soldering may cause smearing and dirtying and misalignment in handling to an extent that might result in an unacceptable unit.

In addition to improving product yield and reproducibility, the invention accomplishes these improvements in conjunction with a substantial reduction of operators needed to maintain a given rate of production. Thus, a reduction of 25% to 50% in the number of operators required for a given rate of production can be obtained by using the present invention instead of conventional manual assembly techniques.

Following the soldering operations, the units are removed from the belt 119 and placed in individual carriers which hold the lower portions of posts or leads 13, 14 and 15 in a fixed position and establishes a reference surface for loading in sockets of an automatic etching facility shown at 123 in FIG. 7. The units are plugged into sockets on a moving belt and carried successively through an electrolytic etching bath, a deionized water rinse, a pressurized air-water mist rinse, a high pressure air blow-off, a radiant heat drying position and an unloading position. The units then pass to electrical testing stations which may be provided with automatic sorting and ejection means. Although it is expedient to carry out the etching, washing and testing steps by the mechanized means described, the invention may also be practiced with these steps accomplished by other means whether mechanized or not, and the specific mechanism used in the commercial embodiment of the present invention is not a part of this invention.

Assembly of the transistor is completed by the attachment of cover member 46. The cover is made of mild steel or nickel silver and which rests on the lip or shoulder 11*b* of header 11. The cover member 46 is affixed to the header by welding to such shoulder.

In accordance with one embodiment of the invention, the covered unit is vacuum baked and a suitable heat transfer liquid such as silicone oil is introduced through a pin hole in the cover member to fill the space between it and the transistor components. After filling, the pin hole is sealed. Alternately, the cover member 46 may be turned upside down and filled with a predetermined amount of heat transfer liquid and the partially assembled transistor lowered into it and then the cover member suitably affixed. However, certain embodiments of the invention are used in applications where the amount of heat to be dissipated during operation is not great enough to require the presence of a heat transfer liquid in the unit.

Subsequent to etching and washing and before attachment of the cover member 46, the transistor in its partially assembled condition is tested for its electrical and other characteristics. If a particular unit is found defective, the subassembly 17 can subsequently be separated from the header 11 simply by heating to melt the solder and lifting the subassembly off the posts. The header, which forms the most expensive single part of the transistor, can then be reused with another semiconductor die unit and need not be discarded. In other transistor constructions where the electrically operative parts of the transistor are of a construction and assembly less easily put together, and where the parts are welded to the header, it is difficult to make this separation without damaging the header. In such instances, the header cannot be reused and must be scrapped thus adding materially to the overall cost of the entire manufacturing operation.

With the transistor referred to as one embodiment of the present invention, the diminutive size can be more readily understood. For instance, in accordance with a typical embodiment, the header 11 is about 0.345 inch in diameter at shoulder 11*b* and includes mounting leads of 0.004 to 0.007 inch in diameter. The base connector 18 is about 0.200 inch long and supports a semiconductor die about 0.060 inch square. Emitter bead 29 used to form an electrode in such embodiment is 0.010 inch in diameter while collector bead 30 is 0.014 inch in diameter. FIG. 1 of the drawings is on a scale about four times as large as a typical commercial unit. Of course, other sizes of electrodes, leads, etc. can be used by simple modifications in the assembly equipment such as changing the size of the openings in the jig 33. It can readily be appreciated that the accurate and uniform alignment of such minute parts would be difficult if not impossible to achieve manually. However, it is accomplished at a high rate of production by the present invention.

The improved assembly method of the present invention, therefore, permits quick and accurate positioning of the various minute parts of a semiconductor device to be accomplished economically and consistently. In making an alloy junction transistor in accordance with the present invention, a high degree of control can be exercised over the extent of electrode alloying into the semiconductor die by providing independent temperature control of the alloying of each electrode. Furthermore, the process is highly flexible in that it can be adapted to the manufacture of a wide variety of semiconductor devices of different electrical characteristics, thus providing for different customer requirements as they arise in the application of such devices to circuits and electronic equipment.

As to the transistor structure of the present invention which is electrically and mechanically stable, it is particularly suited to assembly by the rapid, easy and automatic techniques of the method and apparatus herein disclosed. Because of the novel structure of the transistor and its component parts, the latter are automatically and properly aligned with one another during assembly to greatly increase the efficiency, to reduce the number of operators employed in contrast to a hand assembly, and to reduce the cost of manufacturing the devices. The transistor structure is particularly adapted for low and medium power applications, and can be used in conjunction with a wide variety of semiconductor bodies and different types of alloyed junctions. Moreover, because of the configuration of the semiconductor subassembly, it can be easily and accurately affixed to support posts of a standardized mounting header by soldering and can easily be removed from the header without injury to the latter if the subassembly is found electrically defective. The mounting header can then be reused with another subassembly. This also effects material manufacturing economies.

In all, therefore, the invention herein disclosed represents an important improvement in the semiconductor art in that it provides technical advances in methods and structures, and provides a commercial advance in a lower cost stable device with very wide areas for application to equipment.

I claim:

1. A semiconductor device including in combination, a mounting header comprising a body portion and first and second pairs of metallic posts held in and extending above the upper surface of said body portion, said second pair of posts having turned-over end portions, and a subassembly comprising a metallic connector strip having a pair of arms and an extension portion between said arms with an edge thereof resting on the upper surface of the body portion of said header, a semiconductor body carried on said connector strip and lead wires extending from said semiconductor body, said lead wires resting on the turned-over portions of said second pair of posts, apertured holding means at the end of each of said arms interlocking with said first pair of posts, and solder connections between said arms and said first pair of posts and between said lead wires and the turned-over portions of said second pair of posts, said apertured holding means and said turned-over posts and said extension portion of said connector strip being so constructed and arranged to facilitate positioning of said subassembly on said header and to hold said subassembly against movement relative to said header during a part of the assembly of said device before making said soldered connections.

2. A semiconductor device including in combination, a mounting header comprising a body portion and first and second pairs of metallic posts held in and extending above the upper surface of said body portion, and a subassembly comprising a connector strip having a pair of arms and an extension portion between said arms with an edge portion thereof resting on the upper surface of the body portion of said header, a semiconductor body carried on said connector strip in a position offset from the center thereof and lead wires extending from said semiconductor body, said second pair of posts having end portions turned over toward the end of said connector toward which said semiconductor body is offset, apertured holding means at the end of each of said arms interlocking with said first pair of posts, and solder connections between said arms and said first pair of posts and between said lead wires and said second pair of posts, said apertured holding means and said metallic posts and said extension portion of said connector strip being so constructed and arranged as to facilitate positioning of said subassembly on said header and to hold said subassembly against movement relative to said header during a part of the assembly of said device and before making said solder connections.

3. A semiconductor device including in combination, a mounting header comprising a body portion and first and second pairs of metallic posts held in and extending above the upper surface of said body portion, and a subassembly having a shorter arm and a longer arm and an extension portion between said arms with an edge portion thereof resting on the upper surface of the body portion of said header, a semiconductor body mounted on the extension portion of said connector, lead wires extending from said semiconductor body, said second pair of posts having end portions turned over toward the shorter arm of said connector and forming an acute angle with the upper surface of said body portion of said header, apertured holding means at the end of each of said arms engaging said first pair of posts and solder connections between said arms and said first pair of posts and between said lead wires and said second pair of posts, said apertured holding means and said metallic post and said extension portion of said connector strip being so constructed and arranged as to facilitate positioning of said subassembly on said header and to hold said subassembly against movement relative to said header during a part of the assembly of said device before making said solder connections.

4. A semiconductor device including in combination, a mounting header comprising a body portion and first and second pairs of metallic posts held in and extending above the upper surface of said body portion, said second pair of posts having turned over end portions with respect to the upper surface, a subassembly comprising a metallic connector strip having a pair of arms and a widened portion between said arms, said widened portion having a curved edge resting on the upper surface of the body portion of said header, a semiconductor body carried on said widened portion, and a pair of lead wires secured to and extending from said semiconductor body, solder connections between said arms and said first pair of posts and between said lead wires and the turned over portion of said second pair of posts, means at the ends of said arms engaging said first pair of posts and cooperating with said posts to facilitate positioning of said subassembly with respect to said posts in the original assembly of the subassembly thereon and to thereafter retain said subassembly against lateral movement during establishment of said solder connections, said lead wires being adapted to move downwardly along said turned portions of said second pair of posts and said connector being so constructed and arranged as to turn along said curved edge during establishment of said solder connections so that said subassembly tends to settle to a stable mounting position on said header during assembly of said device.

5. A semiconductor device including in combination, a mounting header comprising a body portion and first and second pairs of upstanding metallic posts held in and extending above the upper surface of said body portion, said second pair of posts having turned-over end portions, and a preassembled self-jigging subassembly soldered to said posts, said subassembly comprising a connector strip having a pair of arms, apertured holding portions at the ends of each of said arms engaging one of said first pair of posts, a semiconductor body carried on said connector strip, and lead wires extending from opposite sides of said body and resting on said turned-over end portions of said second pair of posts with an edge portion of said connector strip resting on the upper surface of the body portion of said mounting header.

6. In a semiconductor device which includes a semiconductor die unit, a mounting and connection system which serves positioning functions in the assembly of the device and provides mechanical connections and electrical connections in the completed device, said mounting and connection system including in combination a base, conductive mounting posts supported by said base and projecting from one side thereof, connector means having a portion on which the semiconductor die unit is carried in a position above said base and including first and second connector arms projecting from such portion, said connector arms each having an apertured mounting portion fitting about a respective mounting post and interlocking said arm with said posts, connector wires connected to the semiconductor die unit and extending to respective ones of said mounting posts, with said last-named mounting posts being turned-over with respect to said base to receive and retain said connector wires thereon in the assembly of the device, and solder connections between each said connector wire and connector arm and the corresponding mounting post.

References Cited in the file of this patent

UNITED STATES PATENTS

| | | |
|---|---|---|
| 2,595,475 | McLaughlin | May 6, 1952 |
| 2,796,563 | Ebers et al. | June 18, 1957 |
| 2,810,873 | Knott | Oct. 22, 1957 |
| 2,825,014 | Willemse | Feb. 25, 1958 |
| 2,845,375 | Gobat et al. | July 29, 1958 |
| 2,981,875 | Kelley et al. | Apr. 25, 1961 |
| 3,028,663 | Iwersen et al. | Apr. 10, 1962 |